(12) United States Patent
Strum

(10) Patent No.: US 7,807,960 B2
(45) Date of Patent: Oct. 5, 2010

(54) IMAGER MODULE PACKAGING HAVING TOP AND BOTTOM GLASS LAYERS

(75) Inventor: Avi Strum, Haifa (IL)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 12/216,319

(22) Filed: Jul. 2, 2008

(65) Prior Publication Data

US 2009/0095893 A1    Apr. 16, 2009

Related U.S. Application Data

(60) Provisional application No. 60/947,549, filed on Jul. 2, 2007.

(51) Int. Cl.
*H01J 40/14* (2006.01)

(52) U.S. Cl. .................. 250/239; 257/432

(58) Field of Classification Search .......... 250/239; 257/678, 680, 432–434; 438/64, 65, 106, 438/116
See application file for complete search history.

(56) References Cited

U.S. PATENT DOCUMENTS

| | | | |
|---|---|---|---|
| 2004/0262705 A1* | 12/2004 | Izumi et al. | 257/432 |
| 2006/0043555 A1* | 3/2006 | Liu | 257/680 |
| 2007/0052050 A1* | 3/2007 | Dierickx | 257/432 |
| 2007/0241273 A1* | 10/2007 | Kim et al. | 250/239 |

* cited by examiner

*Primary Examiner*—Thanh X Luu
(74) *Attorney, Agent, or Firm*—Harness, Dickey & Pierce, P.L.C.

(57) ABSTRACT

An imaging device module includes a circuit mounting layer; a bottom glass layer disposed above the circuit mounting layer; a silicon die disposed above the bottom glass layer; a top glass layer disposed above the silicon layer; and a lens holder disposed above the top glass layer. The silicon die includes an image sensor. The lens holder contains an optical component.

10 Claims, 4 Drawing Sheets

IMAGER MODULE PACKAGING HAVING TOP AND BOTTOM GLASS LAYERS

CROSS REFERENCES TO RELATED APPLICATIONS

This non-provisional patent application claims priority under 35 U.S.C. §119(e) to U.S. Provisional Application Ser. No. 60/947,549, filed Jul. 2, 2007, the entire contents of which is incorporated herein by reference.

BACKGROUND

1. Field

Example embodiments relate to module packaging for an electronic imaging device.

2. Description of Related Art

Electronic imaging devices may be used in a plurality of devices ranging from, for example cameras to much smaller devices, for example cellular phones and PDAs (personal digital assistants). Electronic imaging devices may include an optical component, for example a lens, and an image capturing component, for example a CCD (charge coupled device) or CMOS (complimentary metal oxide silicon) pixel array. The image capturing and optical components of an electronic imaging device may be housed together in a single structure. The structure along with the housed image capturing and optical components of an electronic imaging device may be referred to as a module. Products that utilize electronic imaging devices are becoming smaller. Accordingly, it may be advantageous to reduce the size of an electronic imaging device module.

SUMMARY

Example embodiments provide an imaging device module. The module may include a circuit mounting layer; a bottom glass layer disposed above the circuit mounting layer; a silicon die disposed above the bottom glass layer; a top glass layer disposed above the silicon layer; and a lens holder disposed above the top glass layer. The silicon die may include an image sensor. The lens holder may contain an optical component.

A Ball Grid Array (BGA) layer may be arranged between the circuit mounting layer and the bottom glass layer. The circuit mounting layer may be a printed circuit board (PCB), a flexible printed circuit (FPC), or the like.

The lens holder may include first and second pairs of parallel sides. The first pair of parallel sides may be affixed to the circuit mounting layer. The second pair of parallel sides may be affixed to the top glass layer.

A pixel array may be formed on the silicon die. The pixel array may be disposed off-center with respect to the silicon die. The lens holder may be disposed so that the center of the optical component is above the surface area of the pixel array.

BRIEF DESCRIPTION OF DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
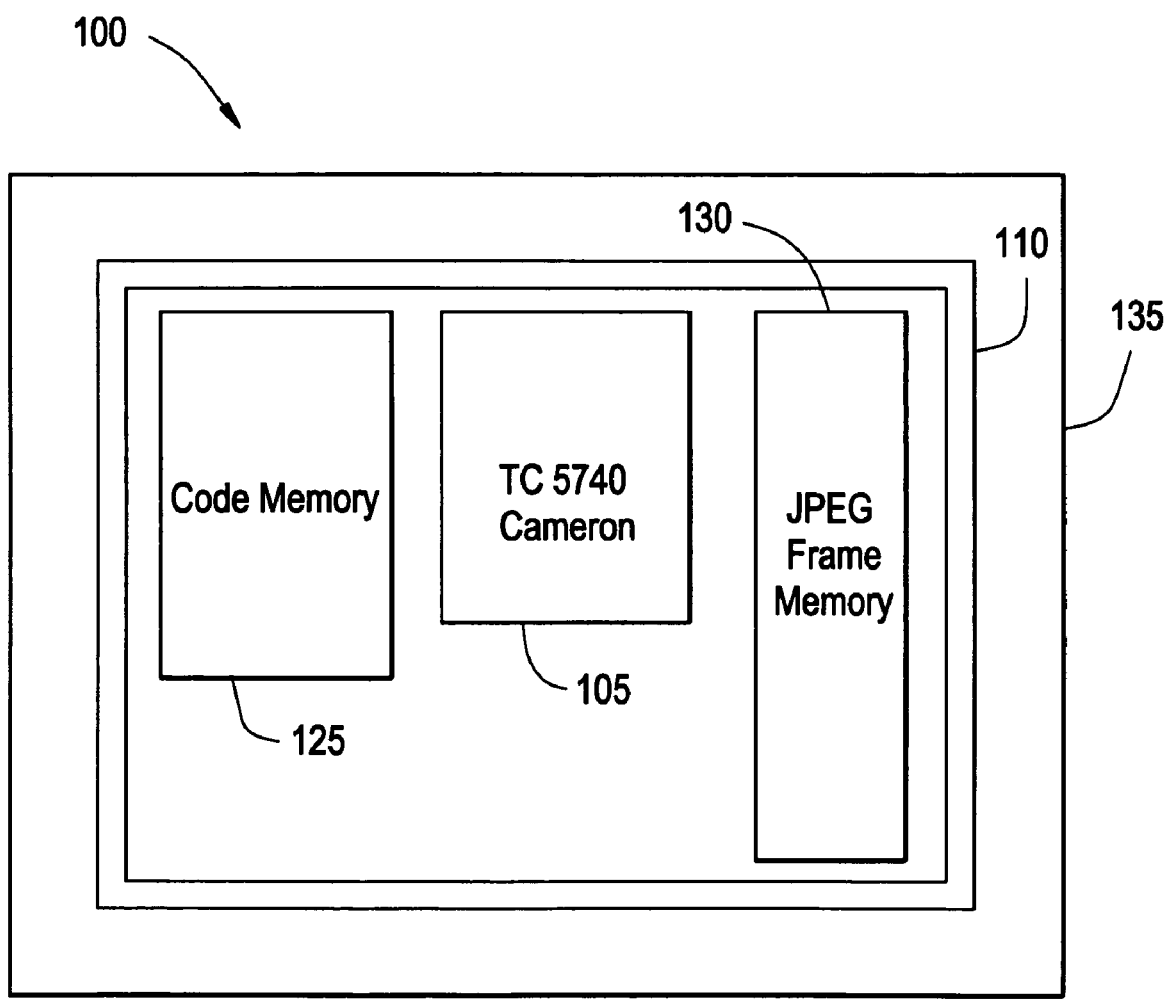
FIG. 1 illustrates a silicon die according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a silicon die 100. Silicon die 100 may include a pixel array 105, a code memory section 125, and a JPEG Frame Memory 130. Silicon die 100 may be a Cameron D0 die. Pixel array 105 may be a 514×656 pixel array.

A seal ring 110 may be formed around Silicon die 100. Seal ring 110 may have a width of about 35 μm. Silicon die 100 may be formed on a silicon wafer including a plurality of other silicon dice. Each silicon die on a wafer may include a seal ring. The seal rings of the plurality of silicon dice on a wafer may have an area of separation between them. For example, seal ring 110 may be separated from adjacent seal rings on a wafer by an area of separation 135. Area of separation 135 may have a width of about 250 μm on each side. A saw blade may be used to divide the silicon wafer into individual silicon dice. The saw blade used to separate silicon die 100 from a silicon wafer may have a width of about 40 μm.

Silicon die 100 may have a size of about 6.8 mm×about 7.45 mm on a wafer. Factors such as the width of seal ring 110, the space between seal rings of the dice surrounding silicon die 100 on the wafer, and the size of a saw blade used to divide the silicone wafer into individual dice may effect the gross size of silicon die 100. For example, silicon die 100 may have a gross die size of about 7.1 mm by about 7.75 mm.

Figure 2:
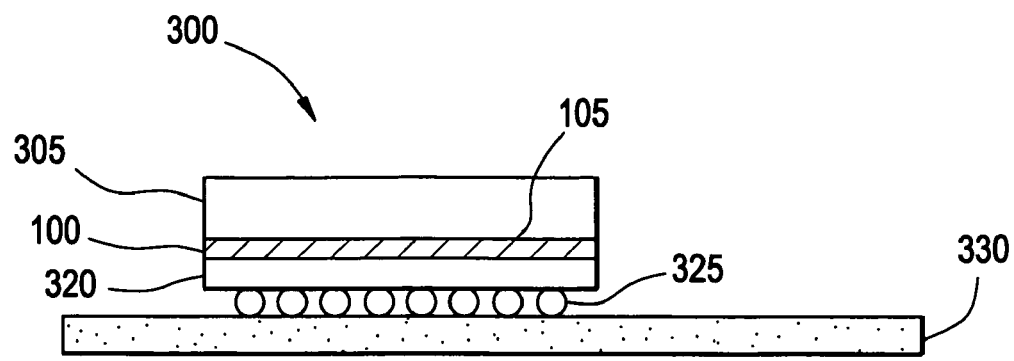
FIG. 2 illustrates a cross-sectional view of a module package according to example embodiments.

FIG. 2 illustrates a cross-sectional view of a die package 300 for silicon die 100. Referring to FIG. 2, die package 300 may be disposed on a PCB 330. Though die package 300 will be described as being connected to PCB 330, example embodiments are not limited to this description. For example, die package 300 may be connected to other types of supports, for example a flexible printed circuit board (FPCB). Die package 300 may include silicon die 100; a top glass layer 305; a bottom glass layer 320; and Ball Grid Array (BGA) 325. Die package 300 may be, for example, a wafer-level ShellCase ShellOP or ShellCase ShellOC package.

As FIG. 2 illustrates, top glass layer 305 may be disposed on silicon die 100; silicon die 100 may be disposed on bottom glass layer 320; bottom glass layer 320 may be disposed on the BGA 325; and BGA 325 may be disposed on PCB 330. Silicon die 100 may be disposed so that pixel array 105 faces top glass layer 305. The PCB 330 may include a plurality of leads electrically connected to logical components on the PCB 330. Top glass layer 305 may be about 3.2 to 4 times as thick as bottom glass layer 320. Top glass layer 305 about 3.8 to 5.2 times as thick as silicon layer 100.

Silicon die 100 may include a plurality of pads that are electrically connected to the BGA 325. The BGA 325 may form an electrical connection between the logical components on silicon die 100 and logical components connected to PCB 330. The number of balls in BGA 325 may be equal to the number of pads on silicon die 100. For example, silicon die 100 may have about 73-76 pads and BGA 325 may include 73-76 balls. The number of pads disposed on silicon die 100 may be chosen based on a design rule with a pitch of about 350 μm.

According to at least one example embodiment of die package 300, top glass layer 305 may have a thickness of about 400 μm; silicon die 100 may have a thickness of about 70 μm; bottom glass layer 320 may have thickness of about 125 μm; and balls in the BGA 325 may have a height between about 150-200 μm, inclusive, after annealing. According to at least this example embodiment of die package 300, pixel array 105 may be about 350-400 μm, inclusive, above the surface of PCB 330.

According to another example embodiment of die package 300, top glass layer 305 may have a thickness of about 500 μm; silicon die 100 may have a thickness of about 130 μm; bottom glass layer 320 may have thickness of about 130 μm; and balls in the BGA 325 may have a height between 150-200 μm after annealing. According to at least this example embodiment of die package 300, pixel array 105 may be 400-450 μm above the surface of PCB 330.

Figure 3:
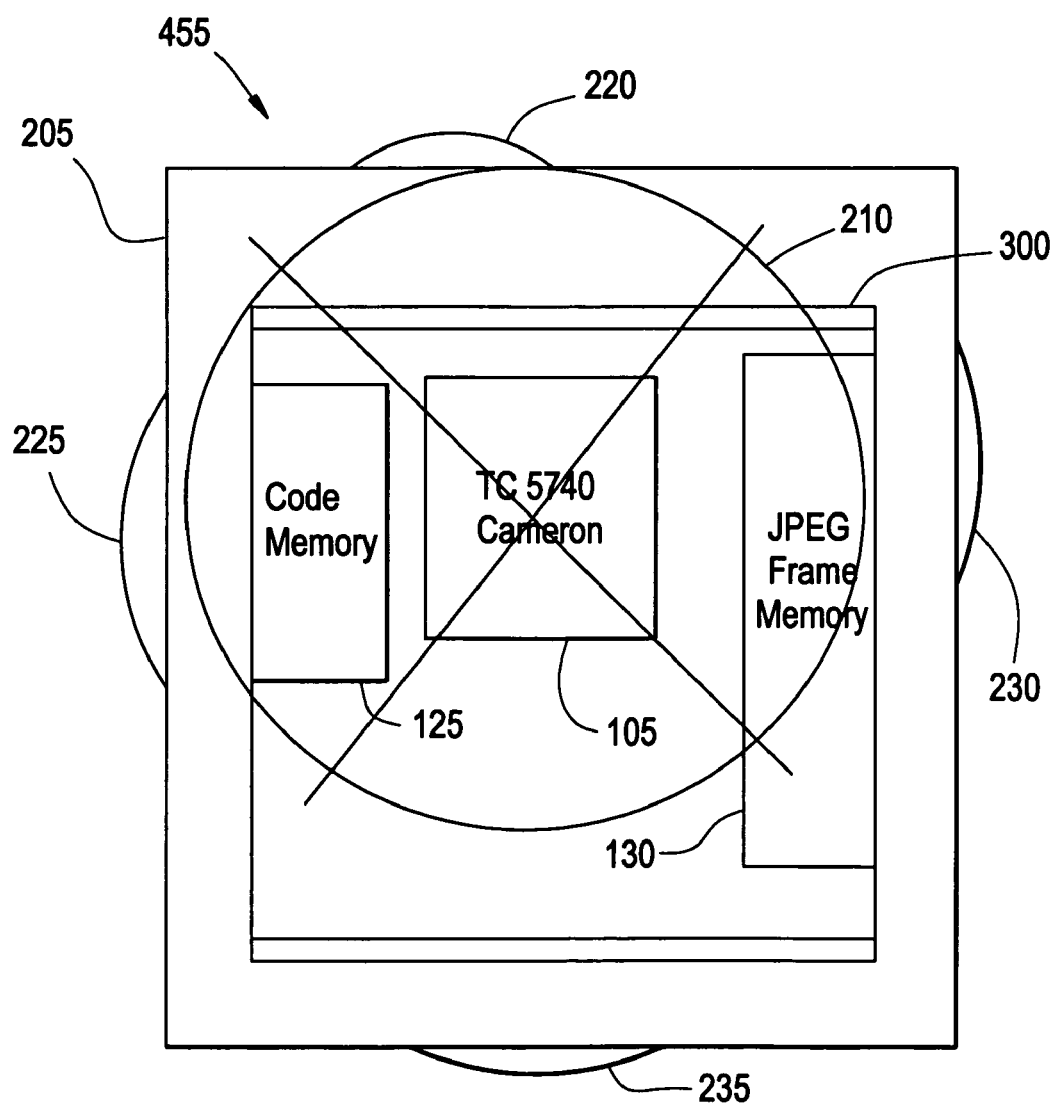
FIG. 3 illustrates a lens holder and a silicon die according to example embodiments.

FIG. 3 illustrates an imager module 455 from a plan view, according to example embodiments. Imager module 455 may include die package 300 and lens holder 205.

Referring to FIG. 3, a lens holder 205 may be disposed around die package 300. Lens holder 205 may hold a lens barrel 210 above die package 300. In FIG. 3, the top layer of lens holder 205 is not pictured and an outline of lens barrel 210 is super imposed over die package 300 to illustrate an example of the positioning of lens barrel 210 with respect to die package 300. As FIG. 3 illustrates, lens barrel 210 may be centered above pixel array 105. According to example embodiments, pixel array 105 may be disposed off-center with respect to die package 300 thus, lens barrel 210 may also be disposed off-center with respect to die package 300.

As FIG. 3 illustrates, one of the walls of lens holder 205 may be thicker than the other lens holder walls to accommodate the off-center positioning of lens barrel 210. For example, referring to FIG. 3, west wall 225, south wall 235 and east wall 230 of lens holder 205 may have a thickness of, for example about 0.5 mm while the north wall 220 may have a thickness of, for example about 1.3 mm. The dimensions of the lens holder 205 may be about 7.6 mm to about 7.75 mm by about 8.9 mm to about 9 mm, inclusive.

Figure 4:
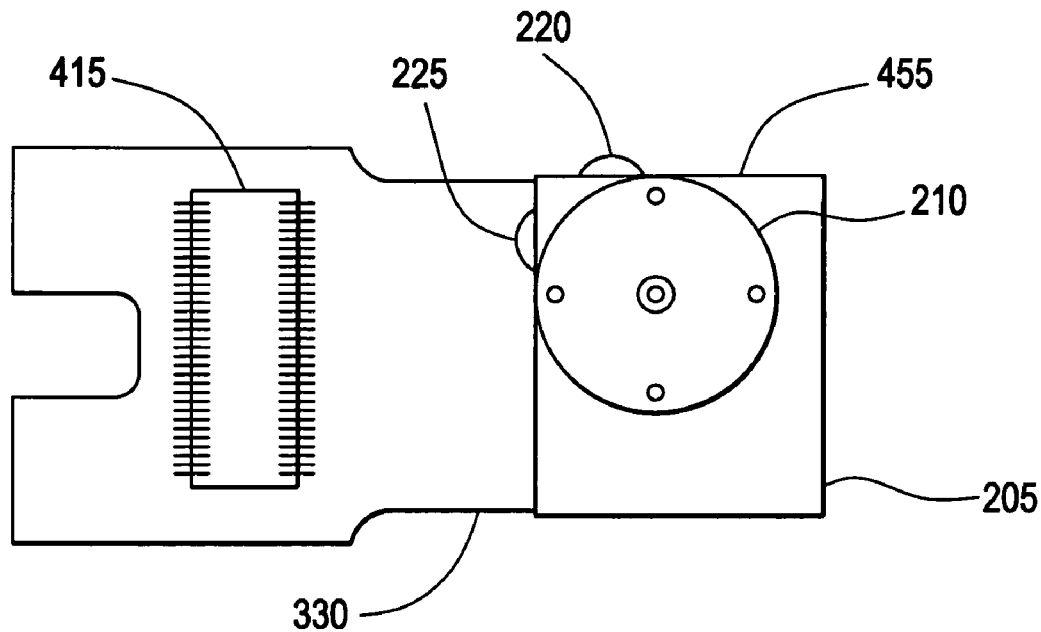
FIG. 4 illustrates a lens holder on a printed circuit board (PCB) according to example embodiments.

FIG. 4 illustrates lens holder 205 mounted on PCB 330 from a plan view. Referring to FIG. 4, lens holder 205 may include lens barrel 210. As FIG. 4 illustrates, lens barrel 210 may be disposed adjacent to north wall 220 and west wall 225 of lens holder 205. PCB 330 may include a multi-pin (e.g., 50 pin) board-to-board connector 415.

Figure 5:
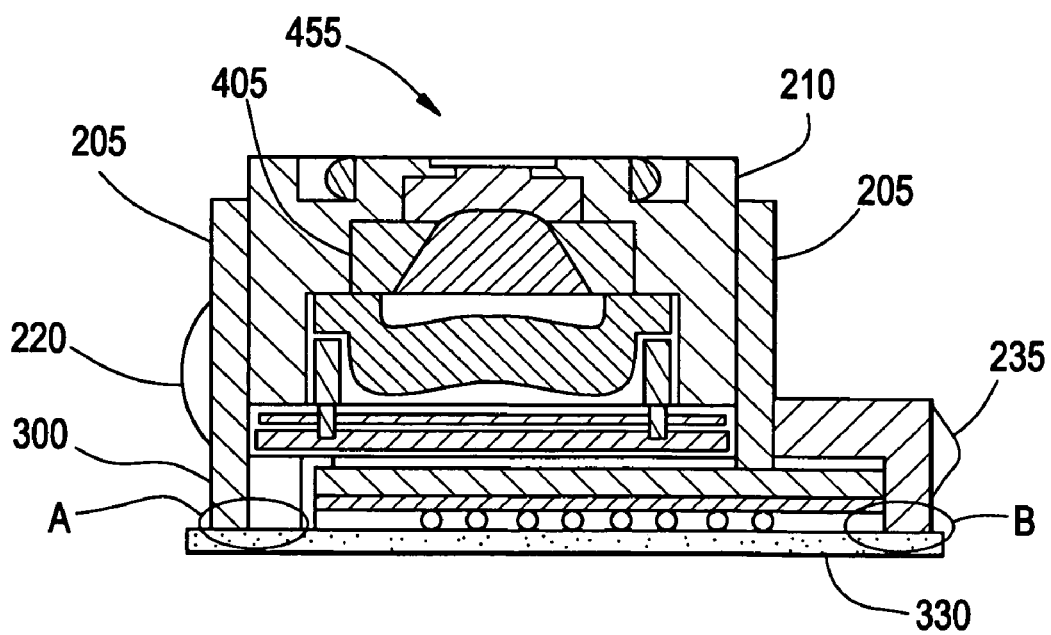
FIG. 5 illustrates a cross-sectional view of a module package on a PCB with a lens holder according to example embodiments.
Figure 6:
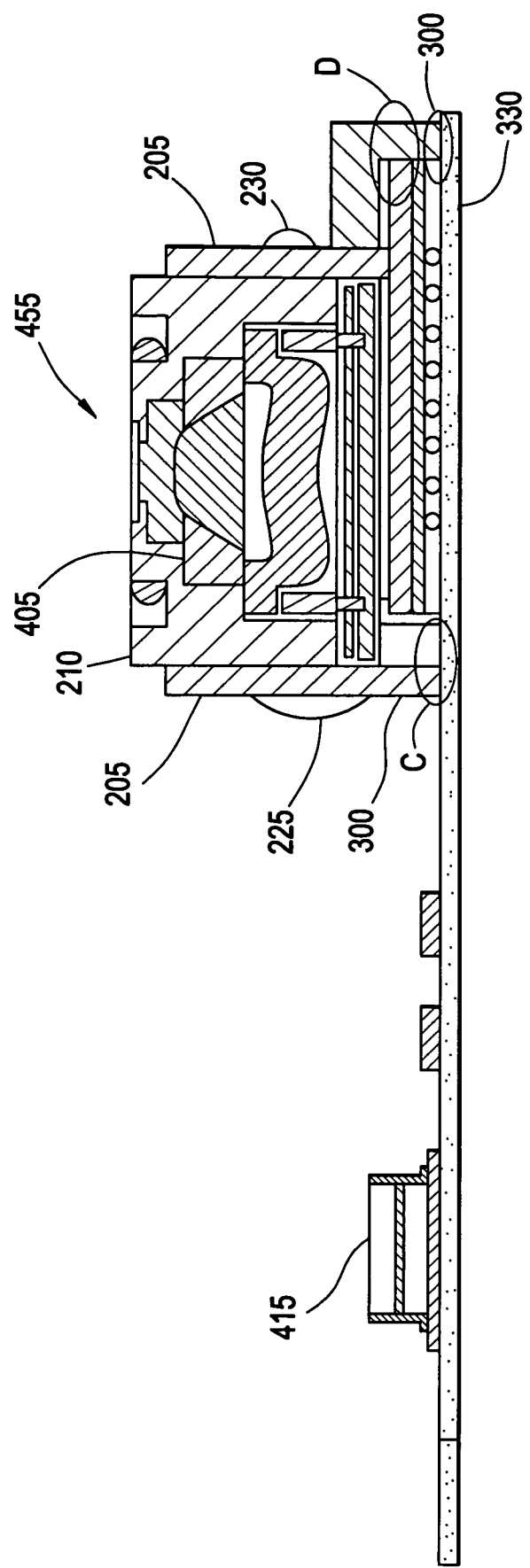
FIG. 6. illustrates another cross-sectional view of a module package on a PCB with a lens holder according to example embodiments.

FIG. 5 and FIG. 6 illustrate cross sectional views of image module 455 according to example embodiments. Image module 455 may include die package 300, lens holder 205 and lens barrel 210. FIG. 5 illustrates north wall 220 and south wall 235 of lens holder 205. FIG. 6 is rotated 90 degrees clockwise with respect to FIG. 5 and illustrates west wall 225 and east wall 230 of lens holder 205. The overall height of image module 455 may be about 5.25 mm to about 5.33 mm, inclusive.

Lens holder 205 may have two parallel walls mounted to the top of die package 300 and two parallel sides mounted to PCB 330.

Referring to FIG. 5, the north wall 220 of lens holder 205 may be mounted to PCB 330 at point A, and the south wall 235 of lens holder 205 may be mounted to PCB 330 at point B.

Referring to FIG. 6, the east wall 225 of lens holder 205 may be mounted to die package 300 at point C, and the west wall 230 of lens holder 205 may be mounted to die package 300 at point D.

The west wall 225 and east wall 230 of lens holder 205 may be mounted on the top glass layer 305 of Shell Op die package 300.

Referring to FIGS. 5 and 6, lens holder 205 may include an optical component 405 inside lens barrel 210. Optical component 405 may be, for example, a lens or a plurality of lenses. Lens barrel 210 may be, for example, an M6 lens barrel. Optical component 405 may be a TC-VGA lens. Due to Snell's Law, the composition of Die package 300 may impact the effective focal length of optical component 405. For example, referring to FIG. 2, a top glass layer 305 of Die package 300 having a thickness of about 400 µm may increase an effective focal length of optical component 405 by about 135 µm, and a top glass layer 305 having a thickness of about 500 µm may increase an effective focal length of the optical component 405 by about 167 µm. As FIG. 6 illustrates, PCB 330 may include a multi-pin board-to-board connector 415.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed:

1. An imaging device module, the module comprising:
   a circuit mounting layer;
   a bottom glass layer disposed above the circuit mounting layer;
   a silicon layer disposed on the bottom glass layer, the silicon layer including an image sensor;
   a top glass layer disposed on the silicon layer; and
   a lens holder disposed above the top glass layer, the lens holder containing an optical component,
   wherein the top glass layer is between 3.2 and 4 times as thick as the bottom glass layer, and the top glass layer is configured to provide an increase in the effective focal length of the optical component of 135 to 167 µm.

2. The module of claim 1, wherein the lens holder includes a first and second pair of parallel sides, the first pair of parallel sides of the lens holder are affixed to the circuit mounting layer.

3. The module of claim 2, wherein the second pair of parallel sides of the lens holder are affixed to the top glass layer.

4. The module of claim 1, further comprising:
   a Ball Grid Array layer between the circuit mounting layer and the bottom glass layer.

5. The module of claim 1, wherein the circuit mounting layer is a printed circuit board.

6. The module of claim 1, wherein the circuit mounting layer is a flexible printed circuit.

7. The module of claim 1, wherein the image sensor includes a pixel array, the pixel array being disposed off-center with respect to the silicon layer.

8. The module of claim 7, wherein a center of the optical component is disposed above the surface area of the pixel array.

9. The module of claim 7, wherein the lens holder holds a lens barrel, the lens holder includes four walls and is rectangular in shape, and the lens barrel is adjacent to only two of the four walls.

10. The module of claim 1, wherein the top glass layer is between 3.8 and 5.2 times as thick as the silicon layer.

* * * * *